(12) United States Patent
Tian et al.

(10) Patent No.: US 10,629,566 B1
(45) Date of Patent: Apr. 21, 2020

(54) SEAMLESSLY INTEGRATED SOFT OLEDS

(71) Applicant: GM Global Technology Operations LLC, Detroit, MI (US)

(72) Inventors: Xue Tian, Shanghai (CN); Houli Chen, Shanghai (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/259,060

(22) Filed: Jan. 28, 2019

(51) Int. Cl.
*H01L 25/04* (2014.01)
*H01L 51/00* (2006.01)

(52) U.S. Cl.
CPC ........ *H01L 25/048* (2013.01); *H01L 51/0097* (2013.01); *H01L 2251/5338* (2013.01); *H01L 2251/5361* (2013.01)

(58) Field of Classification Search
CPC ............... H01L 25/048; H01L 51/0097; H01L 2251/5361; H01L 2251/5338
See application file for complete search history.

(56) References Cited

U.S. PATENT DOCUMENTS

2006/0066223 A1* 3/2006 Pschenitzka ............ H01L 51/50
313/504

* cited by examiner

*Primary Examiner* — Kyoung Lee

(57) ABSTRACT

A seamless connection system for organic light emitting diodes (OLEDs) includes a first OLED strip in electrical communication with a power source via an electrical connector. The first OLED strip includes a first illuminated portion, and a first non-illuminated portion. The seamless connection system for OLEDS further includes a second OLED strip in electrical communication with a power source or the first OLED strip via an electrical connector. The second OLED strip includes a second illuminated portion, and a second non-illuminated portion. The first and second non-illuminated portions are substantially transparent, the first non-illuminated portion is adhered to the second illuminated portion, and the second non-illuminated portion is adhered to the first illuminated portion.

20 Claims, 5 Drawing Sheets

SEAMLESSLY INTEGRATED SOFT OLEDS

INTRODUCTION

The present disclosure relates to lighting systems, and more specifically to lighting systems using light emitting diodes (LEDs). LEDs offer a variety of advantages over traditional light sources, such as fluorescent and incandescent light sources. LEDs tend to emit similar luminous flux at lower power consumption levels than equivalent quantities of traditional light sources. In addition, LEDs tend to have a smaller physical footprint, and may produce less heat and or other waste energy than traditional light sources. Accordingly, LEDs tend to consume less electrical energy for a given amount of light output than traditional light sources. In addition, the smaller form factor and light output characteristics of LEDs offer opportunities to equip LED-based lighting systems in more confined spaces than traditional light sources. However, traditional light sources, like LEDs tend to operate as singular light sources. That is, even when placed into an array, LEDs, like traditional light sources produce light as a series of singular points of light. Some ambient lighting applications require physically flexible lighting solutions, such as flexible organic light-emitting diodes (OLEDs), in which a light emitting, or electroluminescent layer is a film of organic material that emits light in response to an electric current. However, even traditional flexible OLED systems have production size and shape limitations. As a result, for applications in which OLED arrays do not meet the packaging, size, and shape limitations, it may be necessary to combine a plurality of OLED arrays. Accordingly, there is a need in the art for OLED-based lighting systems that can be mass produced simply, at low cost, and which offer packaging, production, and energy-consumption advantages over other traditional light sources. Moreover, there is a need in the art for OLED-based lighting systems that provide a light-weight, broadly-applicable, optically continuous light without optical interruptions between OLEDs or between OLED array portions, and which is useable in a wide variety of applications.

SUMMARY

According to several aspects of the present disclosure, a seamless connection system for organic light emitting diodes (OLEDs) includes a first OLED strip in electrical communication with a power source via an electrical connector. The first OLED strip includes a first illuminated portion, and a first non-illuminated portion. The seamless connection system for OLEDS further includes a second OLED strip in electrical communication with a power source or the first OLED strip via an electrical connector. The second OLED strip includes a second illuminated portion, and a second non-illuminated portion. The first and second non-illuminated portions are substantially transparent, the first non-illuminated portion is adhered to the second illuminated portion, and the second non-illuminated portion is adhered to the first illuminated portion.

In another aspect of the present disclosure the first OLED strip and the second OLED strip are flexible and include a plurality of component layers includes a light extraction film disposed overtop a first optically clear adhesive (OCA) layer, the first OCA layer disposed overtop a first protection film, the first protection film disposed overtop a second OCA layer, the second OCA layer disposed overtop an illumination layer, the illumination layer disposed overtop a third OCA layer, and the third OCA layer disposed overtop a second protection film.

In yet another aspect of the present disclosure, the first non-illuminated portion at least partially surrounds the first illuminated portion, the first non-illuminated portion having a first end, a second end, a first side and a second side, the first side and the second side being disposed opposite each other and along longitudinal aspects of the first illuminated portion and defining longitudinal edges of the first OLED strip, the first end and the second end being disposed opposite one another along lateral aspects of the first illuminated portion, the first end and the second end defining lateral edges of the first OLED strip. The second non-illuminated portion at least partially surrounds the second illuminated portion, the second non-illuminated portion having a first end, a second end, a first side and a second side, the first side and the second side being disposed opposite each other and along longitudinal aspects of the second illuminated portion and defining longitudinal edges of the second OLED strip, the first end and the second end being disposed opposite one another along lateral aspects of the first illuminated portion, the first end and the second end defining lateral edges of the second OLED strip, and the first and second ends of each of the first and second non-illuminated portions extend in a longitudinal direction between about 2 mm and about 6.5 mm, and wherein the first and second ends of the first and second non-illuminated portions extend in a lateral direction for a distance substantially equal to a full width of the first and second OLED strips.

In still another aspect of the present disclosure the first and second ends of each of the first and second non-illuminated portions extend in a longitudinal direction for between about 2 mm and about 6.5 mm, and the first and second ends of the first and second non-illuminated portions extend in a lateral direction for a distance substantially equal to a full width of the first and second OLED strips.

In still another aspect of the present disclosure the full width of the first OLED strip is substantially equal to the sum of a lateral width of the first illuminated portion and a lateral width of the first side and the second side of the first non-illuminated portion, and the full width of the second OLED strip is substantially equal to the sum of a lateral width of the second illuminated portion and a lateral width of the first side and a lateral width of the second side of the second non-illuminated portion.

In still another aspect of the present disclosure the first and second non-illuminated portions include a circuit portion and a transparent portion.

In still another aspect of the present disclosure the transparent portion extends in a lateral direction for a distance substantially equal to a width of the first and second illuminated portions.

In still another aspect of the present disclosure the circuit portion includes an electrically conductive material.

In still another aspect of the present disclosure the first non-illuminated portion is adhered to the second illuminated portion by an optically clear adhesive (OCA), and the second non-illuminated portion is adhered to the first illuminated portion by an OCA.

In still another aspect of the present disclosure each of the first and second OLED strips has a thickness of up to about 0.8 mm.

In still another aspect of the present disclosure a plurality of first and second OLED strips are adhered to one another to form an optically continuous, luminous OLED array.

In still another aspect of the present disclosure a seamless connection system for flexible organic light emitting diodes (OLEDs) includes a first OLED strip in electrical communication with a power source via an electrical connector. The first OLED strip includes a first illuminated portion having a first width and a first length; a first non-illuminated portion surrounding the first illuminated portion, the first non-illuminated portion having a first end, a second end, a first side and a second side, the first side and the second side being disposed opposite each other and extending along longitudinal aspects of the first illuminated portion for at least the first length and defining longitudinal edges of the first OLED strip, the first end and the second end being disposed opposite one another and extending along lateral aspects of the first illuminated portion, the first end and the second end defining lateral edges of the first OLED strip. The system further includes a second OLED strip in electrical communication with a power source or the first OLED strip via an electrical connector. The second OLED strip includes a second illuminated portion having a second width and a second length; and a second non-illuminated portion surrounding the second illuminated portion, the second non-illuminated portion having a first end, a second end, a first side and a second side, the first side and the second side being disposed opposite each other and extending along longitudinal aspects of the second illuminated portion for at least the second length and defining longitudinal edges of the second OLED strip, the first end and the second end being disposed opposite one another and extending along lateral aspects of the first illuminated portion, the first end and the second end defining lateral edges of the second OLED strip. The first and second non-illuminated portions are substantially transparent, the first non-illuminated portion is adhered to the second illuminated portion, and the second non-illuminated portion is adhered to the first illuminated portion. Each of the first and second OLED strips includes a plurality of component layers includes a light extraction film disposed overtop a first optically clear adhesive (OCA) layer, the first OCA layer disposed overtop a first protection film, the first protection film disposed overtop a second OCA layer, the second OCA layer disposed overtop an illumination layer, the illumination layer disposed overtop a third OCA layer, and the third OCA layer disposed overtop a second protection film.

In still another aspect of the present disclosure the first and second widths are substantially equal to one another, and the first and second ends of each of the first and second non-illuminated portions extend in a longitudinal direction for between about 2 mm and about 6.5 mm, and the first and second ends of the first and second non-illuminated portions extend in a lateral direction for a distance at least as large as the first and second widths.

In still another aspect of the present disclosure a full width of the first OLED strip is substantially equal to the sum of the first width of the first illuminated portion, a lateral width of the first side and to lateral width of the second side of the first non-illuminated portion, and the full width of the second OLED strip is substantially equal to the sum of the second width of the second illuminated portion, a lateral width of the first side, and a lateral width of the second side of the second non-illuminated portion In still another aspect of the present disclosure the first and second non-illuminated portions include a circuit portion and a transparent portion, and the electrical connector is a flat panel connector (FPC).

In still another aspect of the present disclosure the transparent portion extends in a lateral direction for a distance at least as large as the first width and the second width.

In still another aspect of the present disclosure the circuit portion includes an electrically conductive material.

In still another aspect of the present disclosure the first non-illuminated portion is adhered to the second illuminated portion by an optically clear adhesive (OCA), and the second non-illuminated portion is adhered to the first illuminated portion by an OCA.

In still another aspect of the present disclosure each of the first and second OLED strips has a thickness of up to about 0.8 mm.

In still another aspect of the present disclosure a plurality of first and second OLED strips are adhered to one another to form an optically continuous, luminous OLED array.

In still another aspect of the present disclosure a seamless connection system for flexible organic light emitting diodes (OLEDS) of a flexible and optically continuous OLED array includes a plurality of OLED strips in electrical communication with each other, and with a power source via an electrical connector. Each of the plurality of OLED strips includes a first illuminated portion having a first width and a first length. Each of the plurality of OLED strips further includes a first non-illuminated portion surrounding the first illuminated portion, the first non-illuminated portion having a first end, a second end, a first side and a second side, the first side and the second side being disposed opposite each other and along longitudinal aspects of the first illuminated portion and defining longitudinal edges of the first OLED strip, the first end and the second end being disposed opposite one another along lateral aspects of the first illuminated portion, the first end and the second end defining lateral edges of the first OLED strip. Each of the plurality of OLED strips further includes a plurality of component layers including a light extraction film disposed overtop a first optically clear adhesive (OCA) layer, the first OCA layer disposed overtop a first protection film, the first protection film disposed overtop a second OCA layer, the second OCA layer disposed overtop an illumination layer, the illumination layer disposed overtop a third OCA layer, and the third OCA layer disposed overtop a second protection film. The first non-illuminated portions are substantially transparent, the first non-illuminated portion of a first of the plurality of OLED strips is adhered to a first illuminated portion of at least one of a second of the plurality of OLED strips by an OCA, and the first non-illuminated portion of the second OLED strip is adhered to the first illuminated portion of the first OLED strip by an OCA such that the first illuminated portion of the first OLED strip overlaps the first non-illuminated portion of the second OLED strip and the first illuminated portion of the second OLED strip overlaps the first non-illuminated portion of the first OLED strip.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
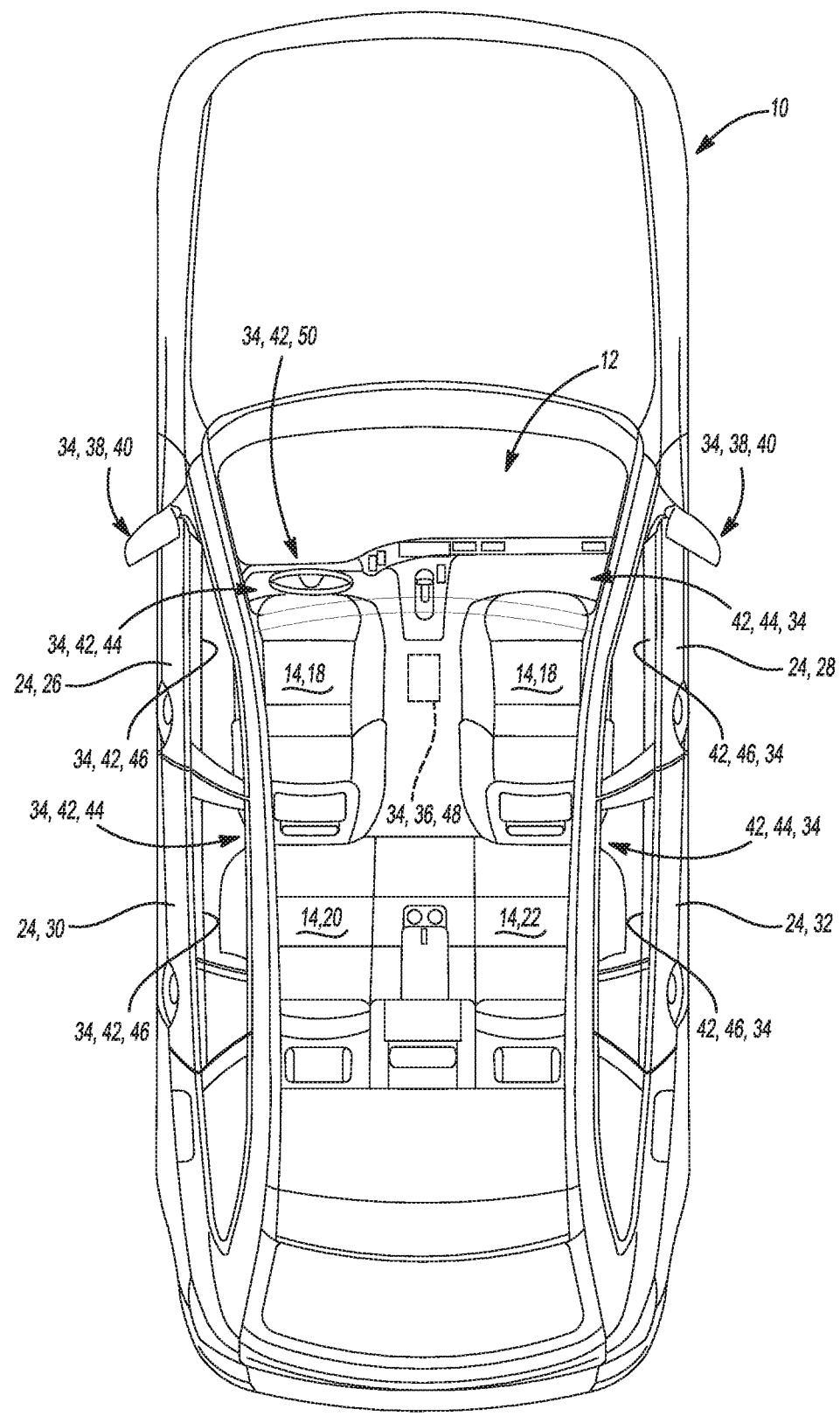
FIG. 1 is an environmental view of a motor vehicle having an array of seamlessly integrated soft OLEDs according to an aspect of the present disclosure.

Reference will now be made in detail to several embodiments of the disclosure that are illustrated in accompanying drawings. Whenever possible, the same or similar reference numerals are used in the drawings and the description to refer to the same or like parts or steps. The drawings are in simplified form and are not to precise scale. For purposes of convenience and clarity, directional terms such as top, bottom, left, right, up, over, above, below, beneath, rear, and front, may be used with respect to the drawings. Likewise, the terms "forward", "rear", "inner", "inwardly", "outer", "outwardly", "above", and "below" are terms used relative to the orientation of the motor vehicle as shown in the drawings of the present application. Thus, "forward" refers to a direction toward a front of a motor vehicle, "rearward" refers to a direction toward a rear of a motor vehicle, "passenger" refers to a direction towards a passenger side of the motor vehicle (right-hand side in the context of this particular application), "driver" or "driver side" refers to a direction towards the driver's side of the motor vehicle (right-hand side in the context of this particular application), "inner" and "inwardly" refers to a direction towards the interior of a motor vehicle, and "outer" and "outwardly" refers to a direction towards the exterior of a motor vehicle, "below" refers to a direction towards the bottom of the motor vehicle, and "above" refers to a direction towards a top of the motor vehicle. These and similar directional terms are not to be construed to limit the scope of the disclosure.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises", "includes," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "disposed on," "connected to," or "coupled to" another element or layer, it may be directly on, engaged, disposed, connected or coupled to the other element or layer, or intervening elements or layers may be present. In contrast, when an element is referred to as being "directly on," "directly engaged to," "directly disposed on," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all storage compartmentations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The following description is merely exemplary in nature and is not intended to limit the present disclosure, application, or uses.

Lighting, and in particular customizable lighting systems are being used in a seemingly ever-increasing number of applications. From interior and exterior lighting for houses and motor vehicles, to lighting systems disposed on everyday objects and surfaces, such as walls, mirrors, mugs, cupholders, pen or pencil containers, thermostats, telephones, and the like. For ease of understanding, the bulk of the present disclosure will focus on lighting systems disposed in or on motor vehicles. However, it should be appreciated that the same or similar lighting systems may be used or applied in connection with any of the above referenced examples, and others, without departing from the scope or intent of the present disclosure.

Referring now to FIG. 1, a motor vehicle is shown and generally indicated by reference number 10. While the motor vehicle is illustrated as a car, it should be appreciated that the motor vehicle 10 may be any type of vehicle including a car, a van, a truck, a bus a motor home, an aircraft, a spacecraft, a water craft, or any other such vehicle without departing from the scope or intent of the present disclosure. The motor vehicle 10 includes a passenger compartment 12. The passenger compartment 12 is a volume into which motor vehicle 10 passengers may enter and thereafter use the motor vehicle 10 for transport to another location. In several aspects, the passenger compartment 12 is equipped with a plurality of seats 14 including a driver seat 16, a passenger seat 18, a left rear seat 20, and a right rear seat 22. The motor vehicle 10 also includes a plurality of doors 24. The driver seat 16 is positioned proximate a driver door 26, and the passenger seat 18 is positioned proximate a passenger door 28. In some examples, the left rear seat 20 is positioned proximate left rear door 30 and the right rear seat 22 is positioned proximate a right rear door 32. It should be appreciated, that depending on the particular motor vehicle, each of the plurality of seats 14 may be placed proximate at least one of the plurality of doors 24. However, it should be appreciated that depending on the type and construction of a given motor vehicle 10, the quantity of doors 24 and the quantity of seats 14 proximate the doors may vary substantially.

In several aspects the passenger compartment 12 is equipped with a plurality of lights 34. The lights 34 of some motor vehicles 10 include dome lamps 36, courtesy lamps or puddle lamps 38 disposed on or below the motor vehicle 10 doors 24, or one or more of the motor vehicle 10 mirrors 40. Additionally, the passenger compartment 12 is provided with ambient lighting by way of accent lights 42 provided in strategic locations within the passenger compartment 12. For example, the accent lights 42 of some passenger compartments 12 include footwell lights 44, door trim lights 46, overhead or roof panel lights 48, dashboard lights 50, and the like. Because of the varied locations and types of lights 34 used with the motor vehicle 10, and in order to provide an energy-efficient, simple to produce, cost-effective lighting solution for each of the dome lamps 36, puddle lamps 38, and accent lights 42, it is preferable to use light emitting diodes (LEDs) for each of the above referenced lights 34. Moreover, because many of the lights 34 described above are directly exposed to occupants or users of the motor vehicle 10, it is important that the lights 34 be aesthetically appealing. That is, it is important that the lights 34 be substantially optically continuous, presenting a substantially uniform light output throughout the surface of each of the lights 34. Accordingly, using LEDs in the lights 34 is preferable to the use of incandescent bulbs. More specifically, organic light emitting diodes (OLEDs) or OLED strips 52 may be used in a variety of lighting applications within the motor vehicle 10.

Figure 2:
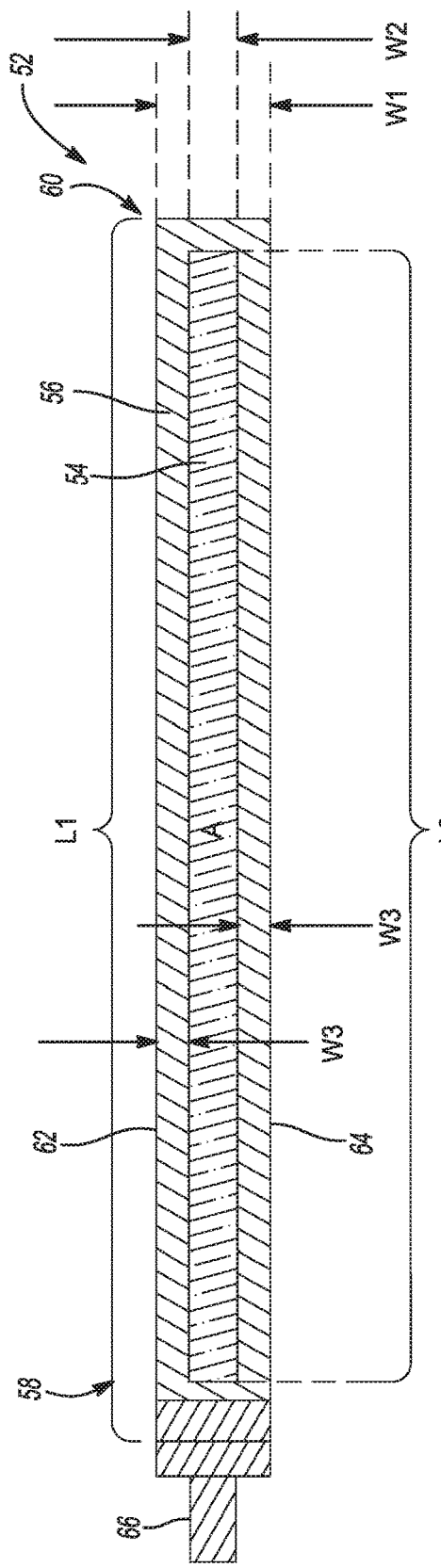
FIG. 2 is a cross sectional view of a soft OLED strip for use in an array of seamlessly integrated soft OLEDs according to an aspect of the present disclosure.
Figure 3:
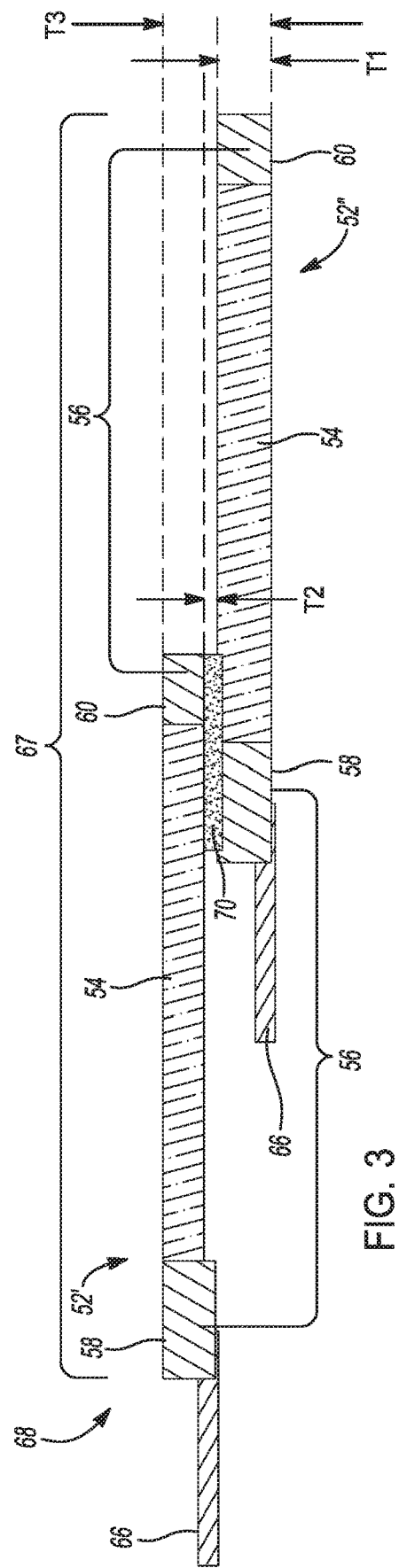
FIG. 3 is a cross sectional view of a soft OLED strip for use in an array of seamlessly integrated soft OLEDs and showing a plurality of layers according to an aspect of the present disclosure.

Referring now to FIGS. 2 and 3, and with continuing reference to FIG. 1, OLED strips 52 offer several advantages over LEDs and incandescent bulbs. In some examples, OLED strips 52 are physically flexible, malleable, and/or plastically deformable lighting solution. Each OLED strip 52 includes an illuminated portion 54 and a non-illuminated portion 56, and the OLED strip 52 is connected to a power source (not shown) and/or a control module (not shown) by an electrical connector 66. In several aspects, the power source is a battery (not shown), an alternator (not shown), or the like, and the controller is a non-generalized, electronic control device having a preprogrammed digital computer or processor, memory or non-transitory computer readable medium used to store data such as control logic, instructions, image data, lookup tables, etc., and a plurality of input/output peripherals or ports in electronic communication with the lights 34. The processor is configured to execute the control logic or instructions. The controller may have additional processors or additional integrated circuits in communication with the processor. The electrical connector 66 is a flat panel connector (FPC), a zero insertion force (ZIF) connector, or the like.

The illuminated portion 54 is shown as a substantially rectangular section of the OLED strip 52. However, it should be appreciated that the illuminated portion 54 need not be rectangular in shape. Depending on the application and/or manufacturing techniques, the OLED strip 52 may take any of a variety of different shapes, sizes, and forms. Similarly, the illuminated and non-illuminated portions 54, 56 may vary in shape, size, and forms. The non-illuminated portion 56 forms a border extending substantially around the entirety of the illuminated portion 54. At least some of the non-illuminated portion 56 is substantially optically clear or transparent. In the example of FIG. 2, the OLED strip 52 extends for a length "L1" of approximately 148 mm from a first end 58 of the OLED strip 52 to a second end 60 of the OLED strip 52, and extends from a first side 62 of the OLED strip 52 to a second side 64 of the OLED strip 52 for a width "W1" of approximately 6.5 mm. At least one of the first end 58 and the second end 60 is substantially optically clear and/or transparent. The illuminated portion 48 extends for an illuminated length "L2" of approximately 139.5 mm, and an illuminated width "W2" of approximately 3 mm. The non-illuminated portion 56 forms a border around at least a portion of the illuminated portion 54 and extends outward from the illuminated portion 54 for approximately 2 mm. Accordingly, the non-illuminated portion 56 extends for approximately the entirety of the length "L1" and width "W1" of the OLED strip 52, and defines an area "A" in which the illuminated portion 54 resides. However, both the illuminated portion 54 and the non-illuminated portion 56 may have differing dimensions than described above without departing from the scope or intent of the present disclosure. For example, the first end 58 may extend for between about 1 mm and about 6.5 mm, the second end 60 may extend for between about 1 mm and about 4 mm, the first and second sides 62, 64 may extend for between about 1 and about 4 mm without departing from the scope or intent of the present disclosure, the illuminated width "W2" may be from about 2 mm to about 6 mm. In several aspects the electrical connector 66 is disposed substantially at the first end 58 of the OLED strip 52. However, it should be appreciated that the electrical connector 66 may be in electrical connection with and disposed anywhere along the first and/or second ends 58, 60 and/or the first and/or second sides 62, 64 of the OLED strip 52 without departing from the scope or intent of the present disclosure.

With particular reference to FIG. 3, and with continuing reference to FIGS. 1 and 2, a plurality of OLED strips 52 may be seamlessly connected together to form an OLED array 67 using a seamless connection system 68. The seamless connection system 68 utilizes an optically clear adhesive (OCA) 70 disposed between successive OLED strips 52 connected together. That is, a first OLED strip 52' is bonded to a second OLED strip 52" using OCA 70. In order to ensure that the first and second OLED strips 52', 52" form an optically continuous light source, the first and second OLED strips 52', 52" are slightly offset from one another so that the non-illuminated portion 56 of the first OLED strip 52' is back-lit by the illuminated portion 54 of the second OLED strip 52". In the depiction of FIG. 3, the first and second OLED strips 52', 52" are shown offset in a longitudinal direction. The first and second OLED strips 52', 52" are offset by a longitudinal distance approximately equal to the sum of the portion of the length "L1" of the first OLED strip 52' equivalent to the second end 60 of the first OLED strip 52', and the portion of the length "L1" of the second OLED strip 52" equivalent to the first end 58 of the second OLED strip 52". In an example in which the first and second ends 58, 60 of each of the first and second OLED strips 52', 52" has a longitudinal length "L3" of approximately 2 mm, the first OLED strip 52' is offset longitudinally from the second OLED strip 52" by approximately 2 mm+2 mm or 4 mm. It should be appreciated, however, that the first and second OLED strips 52', 52" may also be longitudinally aligned with one another and offset in a lateral direction such that the first and second sides 62, 64 of the first and second OLED strips 52', 52" are offset from one another by a distance of approximately equal to the sum of the lateral widths "W3" of each of the first and second sides 62, 64. Accordingly, in an example in which the lateral widths "W3" of each of the first and second sides 62, 64 is approximately 2 mm, the first and second sides 62, 64 of the first and second OLED strips 52', 52" may be offset by a distance of approximately 2 mm+2 mm or 4 mm. The first and second OLED strips 52', 52" may also be offset in both longitudinal and lateral directions without departing from the scope or intent of the present disclosure. Moreover, while in the foregoing description, only first and second OLED strips 52', 52" have been described, it should be appreciated that any number of OLED strips 52 may be affixed to one another using the seamless connection system 68 described herein.

Figure 4:
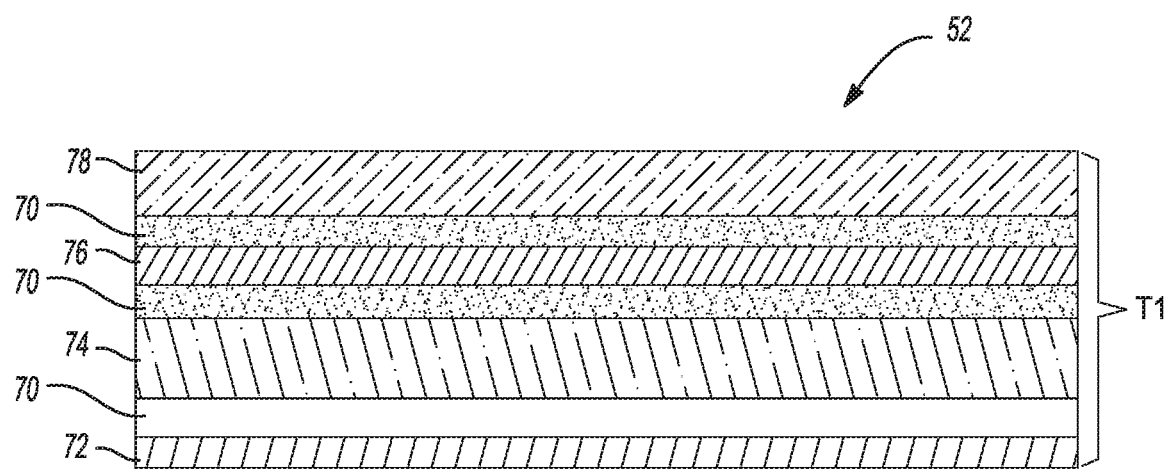
FIG. 4 is a cross sectional view of a plurality of soft OLED strips connected to one another to form an array of seamlessly integrated soft OLEDs according to an aspect of the present disclosure.

Turning now to FIG. 4, and with continuing reference to FIGS. 1-3, each of the OLED strips 52 is formed of a plurality of layers. The plurality of layers and therefore, each of the OLED strips 52, has a first thickness "T1". In several aspects, the first thickness "T1" is between about 0.45 mm and about 0.65 mm, however other thicknesses are contemplated. For example, an OLED strip 52 may have a thickness "T1" of between about 0.1 mm and about 1.0 mm, or between about 0.47 mm and about 0.63 mm without departing from the scope or intent of the present disclosure. Accordingly, the OLED array 67 formed by the first OLED strip 52' and the second OLED strip 52" of FIG. 4 adhered to one another with a layer of OCA 70 having a second thickness "T2" of approximately 0.16 mm to about 0.24 mm, has an overall thickness "T3" amounting to the sum of the first thickness "T1" of the first OLED strip 52', the first thickness "T1" of the second OLED strip 52", and the second thickness "T2" of the OCA 70. Therefore, in a first example, an OLED array 67 of the present disclosure has an overall thickness "T3" of between about 1.06 mm and about 1.54 mm. In a second example, the OLED array 67 of the present disclosure has an overall thickness "T3" of between about 0.36 mm and about 2.24 mm. In a third example, the OLED array 67 has an overall thickness "T3" of between about 1.10 mm and about 1.50 mm. However, it should be appreciated that OLED arrays 67 may have overall thicknesses "T3" that vary substantially depending on the application and construction of the OLED arrays 67 without departing from the scope or intent of the present disclosure.

A base layer or substrate 72 is formed of a protection film. The protection film of some examples is a robust, resilient, impact and scratch resistant material optimized to prevent physical, thermal, and/or water damage to the OLED strip 52. The base layer 72 of some examples is composed of a polyethelene terephthalate (PET) material. However, other materials with similar structural, functional, and optical qualities may also be used without departing from the scope or intent of the present disclosure. In some aspects, the base layer 72 is also composed of an optically clear material. An illumination layer 74 is adhered to the base layer 72 by OCA 70.

The illumination layer 74 may be better described as being composed of several electrically interactive component layers (not specifically shown). In several aspects, the illumination layer 74 includes an anode layer (not shown) overtop of which a conductive layer (not shown) is disposed. An emissive layer (not shown) is disposed overtop the conductive layer, and a cathode layer is disposed overtop the emissive layer. When a voltage source, i.e. the power source, is applied to OLED strip 52, electrons are injected into and fill the cathode, and the anode layer releases or "loses" electrons, thereby creating "electron holes". Electrons traveling from the cathode layer to the anode layer pass through the emissive layer, causing the emissive layer to become negatively charged. Electrostatic forces bring the electrons and the electron holes towards each other, and the electrons and electron holes recombine forming an exciton, a bound state of the electron and the electron hole. The decay of the exciton results in a relaxation of the energy levels of the electron, accompanied by emission of radiation in the form of photons whose frequency is generally visible to humans. While in the foregoing description, the illumination layer 74 has been described as having a plurality of layers, it should be appreciated that the locations and orientations of the layers may vary substantially. In one example, the anode layer is located substantially along one of the first and/or second sides 62, 64 and the cathode layer is disposed on an opposite side of the area "A" and substantially along the other of the first and/or second sides 62, 64. Accordingly, the emissive layer is substantially equivalent to the entirety of the illuminated portion 54 of the OLED strip 52.

A protection film layer 76 is adhered to the illumination layer 74 by OCA 70. As with the base layer 72, the protection film layer 76 is a robust, resilient, impact and scratch resistant material optimized to prevent physical, thermal, and/or water damage to the OLED strip 52. The protection film layer 76 of some examples is composed of a polyethelene terephthalate (PET) material. However, other materials with similar structural, functional, and optical qualities may also be used without departing from the scope or intent of the present disclosure. A light extraction film layer 78 is adhered to the protection film layer 76 by OCA 70. In several aspects, the light extraction film layer 78 extracts, and diffuses light produced by the illumination layer 74 of the OLED strip 52 to produce a substantially optically continuous, even light output over the entirety of the OLED strip 52 illuminated portion 54.

In another example of an OLED strip 52, the plurality of layers includes substantially similar component layers as described above. However the light extraction film layer 78 of some examples is replaced by a polyurethane (PU) material having light diffusion properties. That is, the PU material is combined with or composed of materials having desirable light diffusion properties. In another example, the light extraction film layer 78 is a silicon material having light diffusion properties. As with the PU material, the silicon material is combined with or composed of materials having desirable light diffusion properties. Thus, in each of the foregoing examples, the light extraction film layer 78 extracts and diffuses light produced by the illumination layer 74 of the OLED strip 52 to produce a substantially optically continuous even light output over the entirety of the OLED strip 52 illuminated portion 54.

Figure 5A:
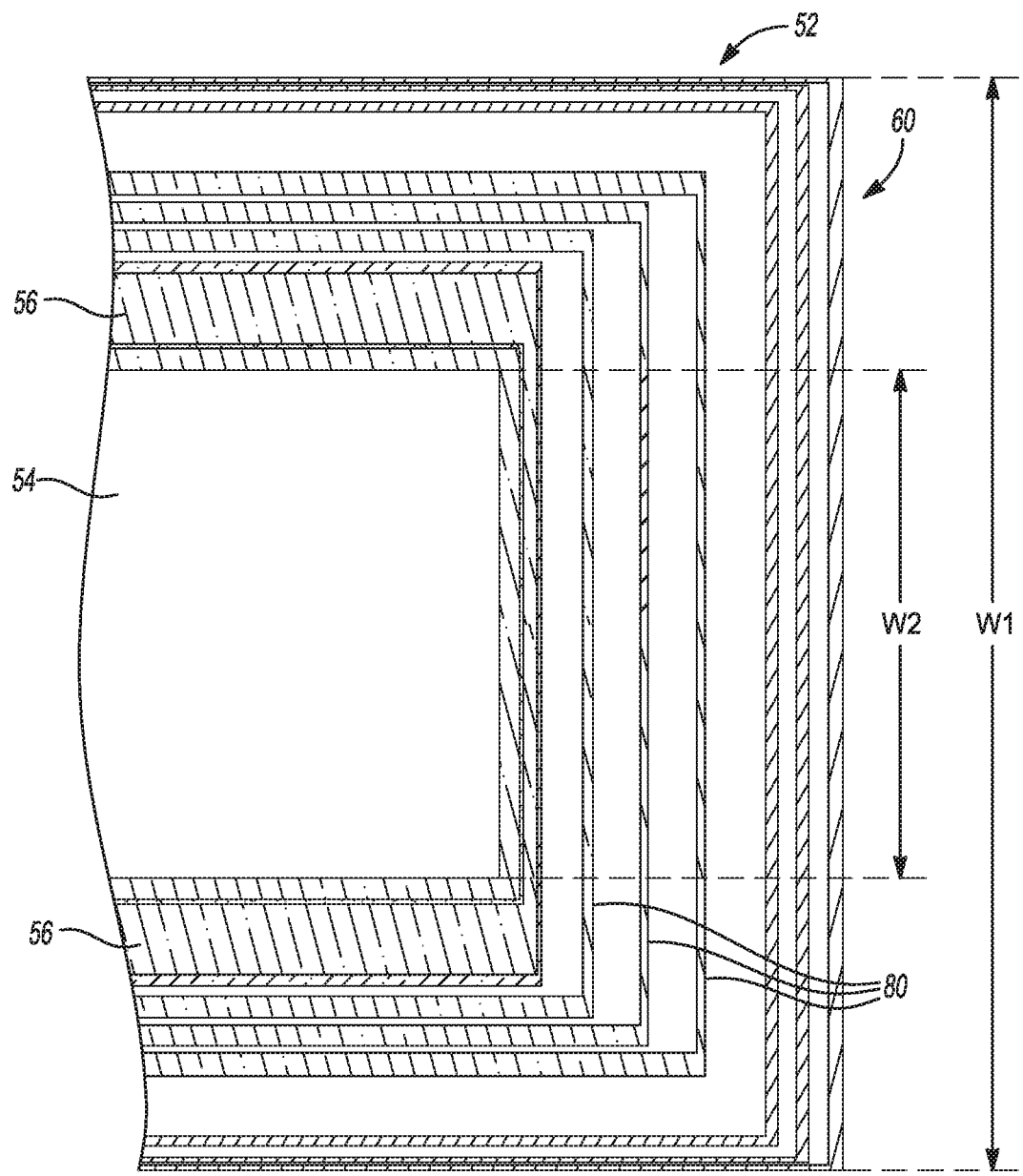
FIG. 5A is a top view of a portion of a soft OLED strip depicting a series of electrical conduits in a first arrangement for use in an array of seamlessly integrated soft OLEDs according to an aspect of the present disclosure.
Figure 5B:
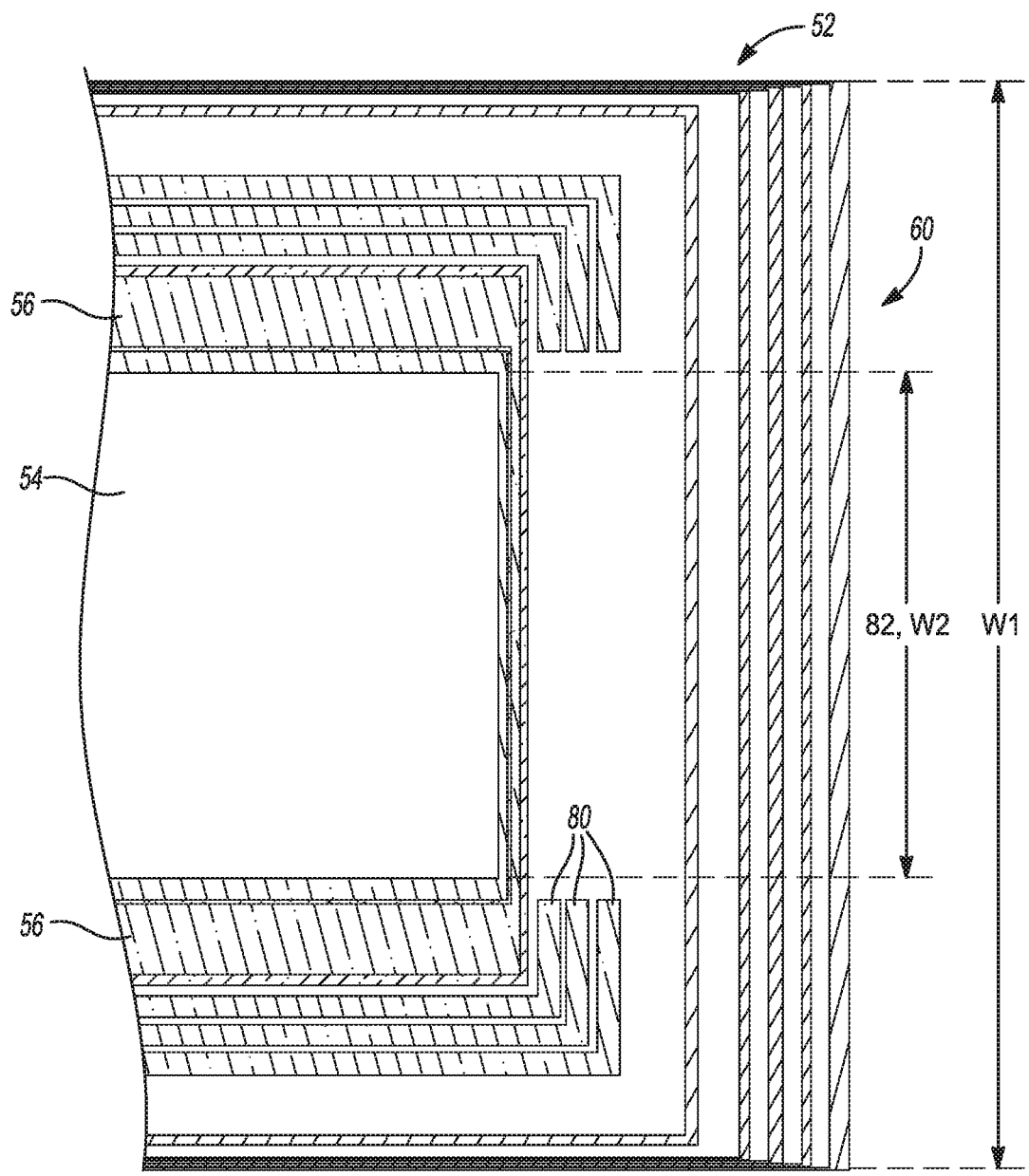
FIG. 5B is a top view of a portion of a soft OLED strip depicting a series of electrical conduits in a second arrangement for use in an array of seamlessly integrated soft OLEDs according to an aspect of the present disclosure.

Turning now to FIGS. 5A and 5B, and with continuing reference to FIGS. 1-4 a portion of the OLED strip 52 is shown in more detail. The OLED strips 52 of both FIGS. 5A and 5B include an illuminated portion 54, and a non-illuminated portion 56. The non-illuminated portion 56 is shown extending substantially around the perimeter of the illuminated portion 54. As described above, the illuminated portion 54 of the OLED strip 52 is in electrical communication with a power source via the electrical connector 66. More specifically, electrical energy from the power source flows through the electrical connector 66 and is directed to the illuminated portion 54 of the OLED strip 52 via a plurality of electrical traces 80. The electrical traces 80 are formed of an electrically conductive material, such as any of a variety of metals and metal alloys. Because the electrical traces 80 are made of substantially non light-conductive, and non transparent materials, in order to for the OLED strips 52 to provide an optically continuous light source when a plurality of the OLED strips 52 are connected to one another as described above, the electrical traces 80 of the non-illuminated portion 56 of at least at the first and second ends 58, 60 are spaced apart from one another. That is, a distance "D" between the electrical traces 80 disposed in the first and second ends 58, 60 of the OLED strip 52 is substantially greater than a width "W4" of each of the electrical traces 80. For example, the width "W4" of each of the electrical traces 80 is approximately 0.3 mm, while the first and/or second ends 58, 60 extend for approximately 2 mm.

By contrast, in the example of FIG. 5B, the electrical traces 80 only partially surround the illuminated portion 54 of the OLED strip 52. That is, the electrical traces 80 extend substantially along the first and second sides 62, 64 of the OLED strip 52. However, the electrical traces 80 define a gap 82 of approximately the same as the illuminated width "W2" of the illuminated portion 54. The gap 82 is free from electrical traces 80, however electrical continuity between the electrical traces 80 is maintained across the illuminated portion 54 of the OLED strip 52, thereby allowing the illuminated portion 54 to emit light. Accordingly, when first and second OLED strips 52', 52" are affixed to one another with OCA 70 in an overlapping fashion as described above, the gap 82 allows light emitted by the second OLED strip 52" disposed below the first OLED strip 52' to pass substantially unencumbered through the first OLED strip 52', thereby creating a substantially optically continuous source of light.

When first and second OLED strips 52', 52", are adhered with OCA 70 to form the OLED array 67, the electrical connector 66 for the second OLED strip 52" is in electrical communication with the power source either directly, or via the electrical traces 80 of the first OLED strip 52'. Similarly, subsequent OLED strips 52 may be affixed to the first and second OLED strips 52', 52" in substantially the same manner in an essentially unlimited fashion. That is, the quantity of OLED strips 52 in an OLED array 67 connected by the seamless connection system 68 is not intended to be limited by this disclosure.

A seamless connection system 68 for organic light emitting diodes (OLEDs) of the present disclosure offers several advantages. These include being physically flexible, low profile or thin, relatively easily mass-produced at low cost, and offering packaging, production, and energy-consumption advantages over other traditional light sources. Moreover, the seamless connection system 68 of the present disclosure is scalable, and therefore not limited to one specific application, and the lights 34 created by using the seamless connection system 68 are optically continuous light sources without optical interruptions between OLEDs or between OLED array portions.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A seamless connection system for organic light emitting diodes (OLEDs) comprising:
   a first OLED strip in electrical communication with a power source via an electrical connector, the first OLED strip comprising:
   a first illuminated portion;
   a first non-illuminated portion; and
   a second OLED strip in electrical communication with a power source or the first OLED strip via an electrical connector, the second OLED strip comprising:
   a second illuminated portion; and
   a second non-illuminated portion,
   wherein the first and second non-illuminated portions are substantially transparent, the first non-illuminated portion is adhered to the second illuminated portion, and the second non-illuminated portion is adhered to the first illuminated portion.

2. The seamless connection system for OLEDs of claim 1 wherein the first OLED strip and the second OLED strip are flexible and include a plurality of component layers comprising:
   a light extraction film disposed overtop a first optically clear adhesive (OCA) layer, the first OCA layer disposed overtop a first protection film, the first protection film disposed overtop a second OCA layer, the second OCA layer disposed overtop an illumination layer, the illumination layer disposed overtop a third OCA layer, and the third OCA layer disposed overtop a second protection film.

3. The seamless connection system for OLEDs of claim 1, wherein
   the first non-illuminated portion at least partially surrounds the first illuminated portion, the first non-illuminated portion having a first end, a second end, a first side and a second side, the first side and the second side being disposed opposite each other and along longitudinal aspects of the first illuminated portion and defining longitudinal edges of the first OLED strip, the first end and the second end being disposed opposite one another along lateral aspects of the first illuminated portion, the first end and the second end defining lateral edges of the first OLED strip, and wherein
   the second non-illuminated portion at least partially surrounds the second illuminated portion, the second non-illuminated portion having a first end, a second end, a first side and a second side, the first side and the second side being disposed opposite each other and along longitudinal aspects of the second illuminated portion and defining longitudinal edges of the second OLED strip, the first end and the second end being disposed opposite one another along lateral aspects of the first illuminated portion, the first end and the second end defining lateral edges of the second OLED strip, and the first and second ends of each of the first and second non-illuminated portions extend in a longitudinal direction for between about 2 mm and about 6.5 mm, and wherein the first and second ends of the first and second non-illuminated portions extend in a lateral direction for a distance substantially equal to a full width of the first and second OLED strips.

4. The seamless connection system for OLEDs of claim 3 wherein the full width of the first OLED strip is substantially equal to the sum of a lateral width of the first illuminated portion and a lateral width of the first side and the second side of the first non-illuminated portion, and the full width of the second OLED strip is substantially equal to the sum of a lateral width of the second illuminated portion and a lateral width of the first side and a lateral width of the second side of the second non-illuminated portion.

5. The seamless connection system for OLEDs of claim 3 wherein the first and second non-illuminated portions include a circuit portion and a transparent portion.

6. The seamless connection system for OLEDs of claim 4 wherein the transparent portion extends in a lateral direction for a distance substantially equal to a width of the first and second illuminated portions.

7. The seamless connection system for OLEDs of claim 4 wherein the circuit portion comprises an electrically conductive material.

8. The seamless connection system for OLEDs of claim 1 wherein the first non-illuminated portion is adhered to the second illuminated portion by an optically clear adhesive (OCA), and the second non-illuminated portion is adhered to the first illuminated portion by an OCA.

9. The seamless connection system for OLEDs of claim 1 wherein each of the first and second OLED strips has a thickness of up to about 0.8 mm.

10. The seamless connection system for OLEDs of claim 1 wherein a plurality of first and second OLED strips are adhered to one another to form an optically continuous, luminous OLED array.

11. A seamless connection system for flexible organic light emitting diodes (OLEDs) comprising:
 a first OLED strip in electrical communication with a power source via an electrical connector, the first OLED strip comprising:
  a first illuminated portion having a first width and a first length;
  a first non-illuminated portion surrounding the first illuminated portion, the first non-illuminated portion having a first end, a second end, a first side and a second side, the first side and the second side being disposed opposite each other and extending along longitudinal aspects of the first illuminated portion for at least the first length and defining longitudinal edges of the first OLED strip, the first end and the second end being disposed opposite one another and extending along lateral aspects of the first illuminated portion, the first end and the second end defining lateral edges of the first OLED strip;
 a second OLED strip in electrical communication with a power source or the first OLED strip via an electrical connector, the second OLED strip comprising:
  a second illuminated portion having a second width and a second length; and
  a second non-illuminated portion surrounding the second illuminated portion, the second non-illuminated portion having a first end, a second end, a first side and a second side, the first side and the second side being disposed opposite each other and extending along longitudinal aspects of the second illuminated portion for at least the second length and defining longitudinal edges of the second OLED strip, the first end and the second end being disposed opposite one another and extending along lateral aspects of the first illuminated portion, the first end and the second end defining lateral edges of the second OLED strip,
 wherein the first and second non-illuminated portions are substantially transparent, the first non-illuminated portion is adhered to the second illuminated portion, and the second non-illuminated portion is adhered to the first illuminated portion, and wherein each of the first and second OLED strips includes a plurality of component layers comprising:
  a light extraction film disposed overtop a first optically clear adhesive (OCA) layer, the first OCA layer disposed overtop a first protection film, the first protection film disposed overtop a second OCA layer, the second OCA layer disposed overtop an illumination layer, the illumination layer disposed overtop a third OCA layer, and the third OCA layer disposed overtop a second protection film.

12. The seamless connection system for OLEDs of claim 11 wherein the first and second widths are substantially equal to one another, and the first and second ends of each of the first and second non-illuminated portions extend in a longitudinal direction for between about 2 mm and about 6.5 mm, and wherein the first and second ends of the first and second non-illuminated portions extend in a lateral direction for a distance at least as large as the first and second widths.

13. The seamless connection system for OLEDs of claim 12 wherein a full width of the first OLED strip is substantially equal to the sum of the first width of the first illuminated portion, a lateral width of the first side and to lateral width of the second side of the first non-illuminated portion, and the full width of the second OLED strip is substantially equal to the sum of the second width of the second illuminated portion, a lateral width of the first side, and a lateral width of the second side of the second non-illuminated portion.

14. The seamless connection system for OLEDs of claim 12 wherein the first and second non-illuminated portions include a circuit portion and a transparent portion, and wherein the electrical connector is a flat panel connector (FPC).

15. The seamless connection system for OLEDs of claim 13 wherein the transparent portion extends in a lateral direction for a distance at least as large as the first width and the second width.

16. The seamless connection system for OLEDs of claim 13 wherein the circuit portion comprises an electrically conductive material.

17. The seamless connection system for OLEDs of claim 11 wherein the first non-illuminated portion is adhered to the second illuminated portion by an optically clear adhesive (OCA), and the second non-illuminated portion is adhered to the first illuminated portion by an OCA.

18. The seamless connection system for OLEDs of claim 11 wherein each of the first and second OLED strips has a thickness of up to about 0.8 mm.

19. The seamless connection system for OLEDs of claim 11 wherein a plurality of first and second OLED strips are adhered to one another to form an optically continuous, luminous OLED array.

20. A seamless connection system for flexible organic light emitting diodes (OLEDS) of a flexible and optically continuous OLED array comprising:
- a plurality of OLED strips in electrical communication with each other, and with a power source via an electrical connector, each of the plurality of OLED strips comprising:
  - a first illuminated portion having a first width and a first length;
  - a first non-illuminated portion surrounding the first illuminated portion, the first non-illuminated portion having a first end, a second end, a first side and a second side, the first side and the second side being disposed opposite each other and extending along longitudinal aspects of the first illuminated portion for at least the first length and defining longitudinal edges of the first OLED strip, the first end and the second end being disposed opposite one another and extending along lateral aspects of the first illuminated portion for substantially the first width, the first end and the second end defining lateral edges of the first OLED strip;
  - a plurality of component layers comprising:
    - a light extraction film disposed overtop a first optically clear adhesive (OCA) layer, the first OCA layer disposed overtop a first protection film, the first protection film disposed overtop a second OCA layer, the second OCA layer disposed overtop an illumination layer, the illumination layer disposed overtop a third OCA layer, and the third OCA layer disposed overtop a second protection film,
- wherein the first non-illuminated portions are substantially transparent, the first non-illuminated portion of a first of the plurality of OLED strips is adhered to a first illuminated portion of at least one of a second of the plurality of OLED strips by an OCA, and the first non-illuminated portion of the second OLED strip is adhered to the first illuminated portion of the first OLED strip by an OCA such that the first illuminated portion of the first OLED strip overlaps the first non-illuminated portion of the second OLED strip and the first illuminated portion of the second OLED strip overlaps the first non-illuminated portion of the first OLED strip.

* * * * *